(12) United States Patent
Kim

(10) Patent No.: US 10,931,308 B2
(45) Date of Patent: Feb. 23, 2021

(54) ERROR CORRECTION CIRCUIT AND METHOD OF OPERATING THE SAME

(71) Applicant: SK hynix Inc., Icheon-si (KR)

(72) Inventor: Jang Seob Kim, Seongnam-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/423,763

(22) Filed: May 28, 2019

(65) Prior Publication Data
US 2020/0119751 A1    Apr. 16, 2020

(30) Foreign Application Priority Data
Oct. 12, 2018  (KR) .................. 10-2018-0122071

(51) Int. Cl.
*H03M 13/00* (2006.01)
*H03M 13/11* (2006.01)
*H03M 13/25* (2006.01)

(52) U.S. Cl.
CPC .... *H03M 13/1128* (2013.01); *H03M 13/1125* (2013.01); *H03M 13/255* (2013.01)

(58) Field of Classification Search
None
See application file for complete search history.

(56) References Cited

U.S. PATENT DOCUMENTS

| | | | |
|---|---|---|---|
| 8,347,195 B1* | 1/2013 | Varnica | H03M 13/1128 714/785 |
| 8,689,074 B1* | 4/2014 | Tai | H04L 1/0051 714/752 |
| 9,977,713 B2* | 5/2018 | Kang | G06F 11/1068 |
| 2009/0319860 A1* | 12/2009 | Sharon | H03M 13/1131 714/752 |
| 2010/0042897 A1* | 2/2010 | Han | H03M 13/1142 714/752 |

(Continued)

FOREIGN PATENT DOCUMENTS

| | | |
|---|---|---|
| KR | 10-2007-0053504 | 5/2007 |
| KR | 10-2008-0026559 | 3/2008 |
| KR | 10-0930240 | 12/2009 |

OTHER PUBLICATIONS

E. Amador, R. Knopp, V. Rezard and R. Pacalet, "Hybrid Iteration Control on LDPC Decoders," 2010 6th International Conference on Wireless and Mobile Communications, Valencia, 2010, pp. 102-106, doi: 10.1109/ICWMC.2010.45. (Year: 2010).*

*Primary Examiner* — Daniel F. McMahon
(74) *Attorney, Agent, or Firm* — Perkins Coie LLP

(57) ABSTRACT

Described herein is an error correction circuit that includes a syndrome check history manager configured to maintain a history of syndrome checks corresponding to one or more iterations of the iterative decoding scheme. The error correction circuit also includes a trapping set detector configured to compare a trapping set determination policy with the history of syndrome checks to determine whether the history of syndrome checks meets criteria of the trapping set determination policy, while error correction decoding is performed, and determine that a trapping set exists when the history of syndrome checks satisfies the trapping set determination policy. The trapping set determination policy is related to at least one of a change in a syndrome vector, a number of UCNs, and a change in the number of UCNs.

28 Claims, 14 Drawing Sheets

(56) References Cited

U.S. PATENT DOCUMENTS

| | | | |
|---|---|---|---|
| 2013/0346824 A1* | 12/2013 | Bolotov | H03M 13/2957 |
| | | | 714/755 |
| 2014/0082461 A1* | 3/2014 | Zhang | H03M 13/658 |
| | | | 714/799 |
| 2015/0365106 A1 | 12/2015 | Wu et al. | |
| 2016/0197624 A1 | 7/2016 | Wang et al. | |

* cited by examiner $$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

FIG. 4

$$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} C_{i1} \\ C_{i2} \\ C_{i3} \\ \vdots \\ C_{i7} \end{bmatrix} = \begin{bmatrix} S_{i1} \\ S_{i2} \\ S_{i3} \end{bmatrix}$$

$$H \qquad\qquad C_i^T \qquad S_i$$

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | −4 | +4 | | | | | | |
| 3 | −4 | −2 | +4 | | | | | |
| 4 | −4 | −2 | +2 | +4 | | | | |
| 5 | −4 | −3 | −2 | +2 | +4 | | | |
| 6 | −4 | −3 | −2 | −1 | +2 | +4 | | |
| 7 | −4 | −3 | −2 | −1 | +1 | +2 | +4 | |
| 8 | −4 | −3 | −2 | −1 | +1 | +2 | +3 | +4 |

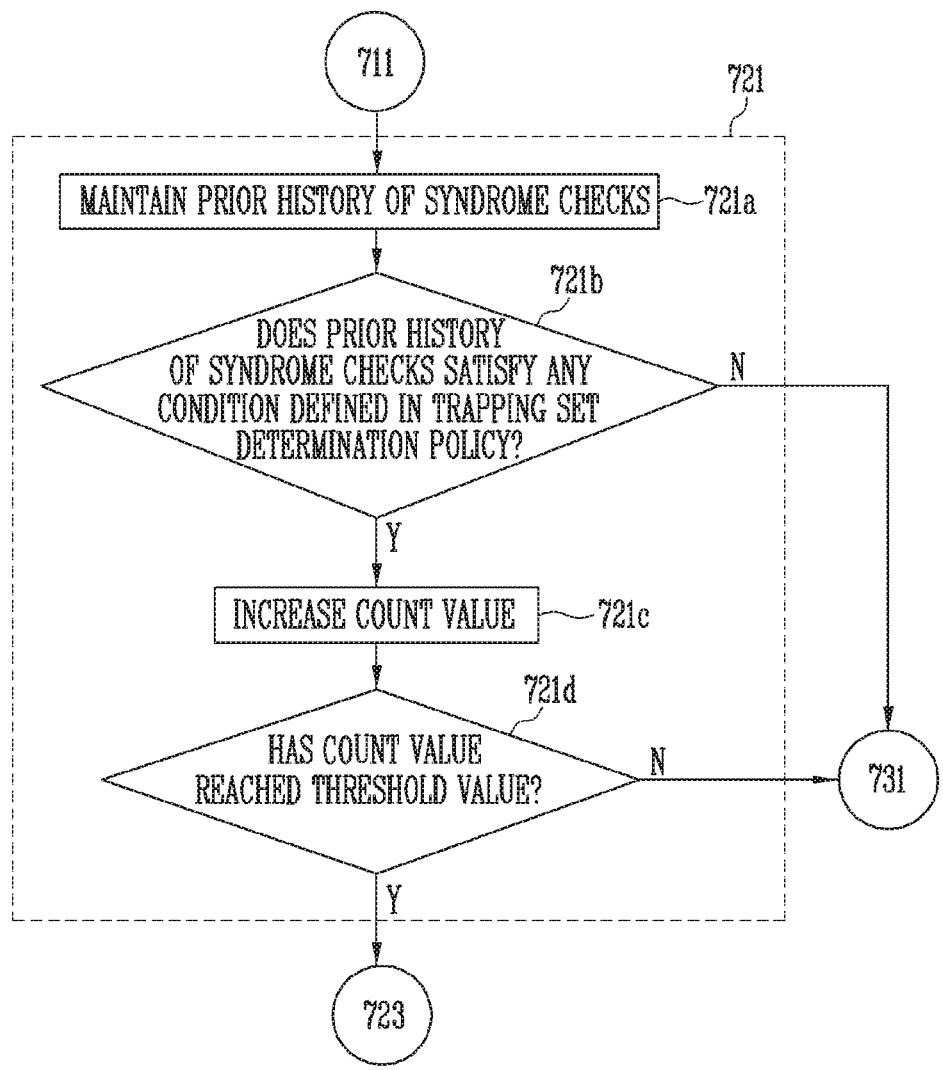

FIG. 9

| | | TRAPPING SET DETERMINATION POLICY |
|---|---|---|
| FIRST POLICY (WHEN COUNT VALUE IS 0) | FIRST CONDITION | SYNDROME VECTOR DOES NOT CHANGE SUCCESSIVELY α1 TIMES |
| | SECOND CONDITION | NUMBERS OF UCNS < β1 SUCCESSIVELY α2 TIMES, SYNDROME VECTOR DOES NOT CHANGE AT LEAST ONE OF α2 TIMES, NUMBER OF UCNS IN CURRENT ITERATION > NUMBER OF UCNS IN IMMEDIATELY PREVIOUS ITERATION |
| | THIRD CONDITION | NUMBERS OF UCNS ≤ β1 SUCCESSIVELY α1 TIMES, NUMBER OF UCNS IN CURRENT ITERATION ≥ NUMBER OF UCNS IN IMMEDIATELY PREVIOUS ITERATION |
| | FOURTH CONDITION | NUMBERS OF UCNS < β1 SUCCESSIVELY α2 TIMES, NUMBERS OF UCNS ARE EQUAL TO EACH OTHER SUCCESSIVELY α2 TIMES |
| | FIFTH CONDITION | NUMBERS OF UCNS < β2 SUCCESSIVELY α2 TIMES, NUMBERS OF UCNS ARE EQUAL TO EACH OTHER SUCCESSIVELY α2 TIMES |
| | SIXTH CONDITION | NUMBERS OF UCNS < β1 SUCCESSIVELY α3 TIMES, NUMBER OF UCNS IS NOT MONOTONOUSLY DECREASED SUCCESSIVELY α3 TIMES |
| | SEVENTH CONDITION | NUMBERS OF UCNS < β2 SUCCESSIVELY α3 TIMES, NUMBER OF UCNS IS NOT MONOTONOUSLY DECREASED SUCCESSIVELY α3 TIMES |
| SECOND POLICY (WHEN COUNT VALUE IS NOT 0) | EIGHTH CONDITION | NUMBER OF UCNS IN CURRENT ITERATION ≥ NUMBER OF UCNS IN IMMEDIATELY PREVIOUS ITERATION |

FIG. 10

<WHEN FIRST CONDITION IS SATISFIED>

| PRIOR HISTORY OF SYNDROME CHECKS ||
|---|---|
| ITERATION | SYNDROME VECTOR |
| i-4 | 1 0 0 1 1 |
| i-3 | 1 0 0 1 1 |
| i-2 | 1 0 0 0 1 |
| i-1 | 1 0 0 0 1 |
| i | 1 0 0 0 1 |

FIG. 11

<WHEN SECOND CONDITION IS SATISFIED>

| PRIOR HISTORY OF SYNDROME CHECKS |||
|---|---|---|
| ITERATION | SYNDROME VECTOR | NUMBER OF UCNS |
| i-4 | 1 0 0 1 1 | 3 |
| i-3 | 1 0 0 1 1 | 3 |
| i-2 | 1 0 0 0 1 | 2 |
| i-1 | 1 0 0 0 1 | 2 |
| i | 1 0 0 1 1 | 3 |

FIG. 12

<WHEN THIRD CONDITION IS SATISFIED>

| PRIOR HISTORY OF SYNDROME CHECKS ||
|---|---|
| ITERATION | NUMBER OF UCNS |
| i-4 | 3 |
| i-3 | 3 |
| i-2 | 2 |
| i-1 | 2 |
| i | 2 |

FIG. 13

<WHEN FOURTH OR FIFTH CONDITION IS SATISFIED>

| PRIOR HISTORY OF SYNDROME CHECKS ||
|---|---|
| ITERATION | NUMBER OF UCNS |
| i-4 | 3 |
| i-3 | 3 |
| i-2 | 3 |
| i-1 | 3 |
| i | 3 |

FIG. 14

<WHEN SIXTH OR SEVENTH CONDITION IS SATISFIED>

| PRIOR HISTORY OF SYNDROME CHECKS | |
|---|---|
| ITERATION | NUMBER OF UCNS |
| i-4 | 3 |
| i-3 | 3 |
| i-2 | 2 |
| i-1 | 1 |
| i | 2 |

FIG. 15

<WHEN EIGHTH CONDITION IS SATISFIED>

| PRIOR HISTORY OF SYNDROME CHECKS | |
|---|---|
| ITERATION | NUMBER OF UCNS |
| i-4 | 3 |
| i-3 | 3 |
| i-2 | 2 |
| i-1 | 2 |
| i | 3 |

ERROR CORRECTION CIRCUIT AND METHOD OF OPERATING THE SAME

CROSS-REFERENCE TO RELATED APPLICATION

This patent document claims priority to the Korean patent application number 10-2018-0122071 filed on Oct. 12, 2018, which is incorporated herein by reference in its entirety for all purposes.

TECHNICAL FIELD

The technology and implementations disclosed in this patent document generally relate to an error correction circuit and a method of operating the error correction circuit.

BACKGROUND

A memory system may include a storage media that stores data on memory devices therein either temporarily or persistently. In order to control errors in data that could have occurred as a result of interferences between adjacent memory cells or any data corruption occurring during writing, reading, transmission, or processing, the memory system may use error correction techniques such as error correction encoding and decoding to ensure data reliability. The error correction techniques may be implemented in the form of hardware and/or software. For example, circuitry for error correction may perform encoding and decoding in the memory system using an error-correction code.

A low density parity check (LDPC) code has performance exceeding other traditional error correction code techniques and has been widely used in communication and other systems. With its iterative decoding scheme, the LDPC coding may improve error correction performance (e.g., error correction capability per bit) as the code length is increased, without increasing computational complexity per bit.

SUMMARY

The technology disclosed in this patent document can be implemented in various embodiments to provide an error correction circuit that detects a trapping set while performing error correction decoding, and to a method of operating the error correction circuit.

An embodiment of the disclosed technology may provide for an error correction circuit for performing error correction decoding based on an iterative decoding scheme. The error correction circuit may include a syndrome check history manager configured to maintain a history of syndrome checks corresponding to one or more iterations of the iterative decoding scheme, and a trapping set detector configured to compare a trapping set determination policy with the history of syndrome checks to determine whether the history of syndrome checks meets a criteria of the trapping set determination policy, while error correction decoding is performed, and determine that a trapping set exists when the history of syndrome checks satisfies the trapping set determination policy, wherein the trapping set determination policy may be related to at least one of a change in a syndrome vector, a number of unsatisfied check nodes (UCNs), and a change in the number of UCNs.

An embodiment of the disclosed technology may provide for a method of operating an error correction circuit, the error correction circuit performing error correction decoding based on an iterative decoding scheme. The method may include maintaining a history of syndrome checks corresponding to one or more iterations of the iterative decoding scheme, comparing a trapping set determination policy with the history of syndrome checks, while error correction decoding is performed, to check whether the history of syndrome checks satisfies the trapping set determination policy, and when the history of syndrome checks satisfies the trapping set determination policy within a maximum iteration number, stopping the error correction decoding, wherein the trapping set determination policy may be related to at least one of a change in a syndrome vector, a number of unsatisfied check nodes (UCNs), and a change in the number of UCNs.

An embodiment of the disclosed technology may provide for an error correction circuit for performing error correction decoding based on an iterative decoding scheme. The error correction circuit may include a syndrome check history manager configured to manage syndrome check histories respectively corresponding to a plurality of iterations, and a trapping set detector configured to match an established trapping set determination policy with the syndrome check histories while error correction decoding is performed, and determine that a trapping set exists when any of the syndrome check histories satisfies the trapping set determination policy, wherein the trapping set determination policy may be related to at least one of a change in a syndrome vector, a number of unsatisfied check nodes (UCNs), and a change in the number of UCNs.

An embodiment of the disclosed technology may provide for a method of operating an error correction circuit, the error correction circuit performing error correction decoding based on an iterative decoding scheme. The method may include managing syndrome check histories respectively corresponding to a plurality of iterations, matching an established trapping set determination policy with the syndrome check histories while error correction decoding is performed, and then checking whether any of the syndrome check histories satisfies the trapping set determination policy, and when any of the syndrome check histories satisfies the trapping set determination policy within a maximum iteration number, stopping the error correction decoding, wherein the trapping set determination policy may be related to at least one of a change in a syndrome vector, a number of unsatisfied check nodes (UCNs), and a change in the number of UCNs.

BRIEF DESCRIPTION OF THE DRAWINGS

FIG. 4 is an example diagram for explaining a syndrome vector calculated using the parity check matrix of FIG. 2.

FIG. 8 is a flowchart illustrating a trapping set detection process based on an embodiment of the disclosed technology.

FIG. 9 is a diagram illustrating a trapping set determination policy based on an embodiment of the disclosed technology.

FIG. 10 is an example diagram illustrating a case where a first condition illustrated in FIG. 9 is satisfied.

FIG. 11 is an example diagram illustrating a case where a second condition illustrated in FIG. 9 is satisfied.

FIG. 12 is an example diagram illustrating a case where a third condition illustrated in FIG. 9 is satisfied.

FIG. 13 is an example diagram illustrating a case where a fourth condition or a fifth condition illustrated in FIG. 9 is satisfied.

FIG. 14 is an example diagram illustrating a case where a sixth condition or a seventh condition illustrated in FIG. 9 is satisfied.

FIG. 15 is an example diagram illustrating a case where an eighth condition illustrated in FIG. 9 is satisfied.

DETAILED DESCRIPTION

Advantages and features of the disclosed technology, and methods for achieving the same will be cleared with reference to embodiments described later in detail together with the accompanying drawings. The disclosed technology is not limited to the following embodiments but embodied in other forms. Rather, these embodiments are provided so that the disclosed technology will be thorough and complete, and will fully convey the technical spirit of the disclosure to those skilled in the art.

Hereinafter, some embodiments of the disclosed technology will be described with reference to the attached drawings.

Figure 1:
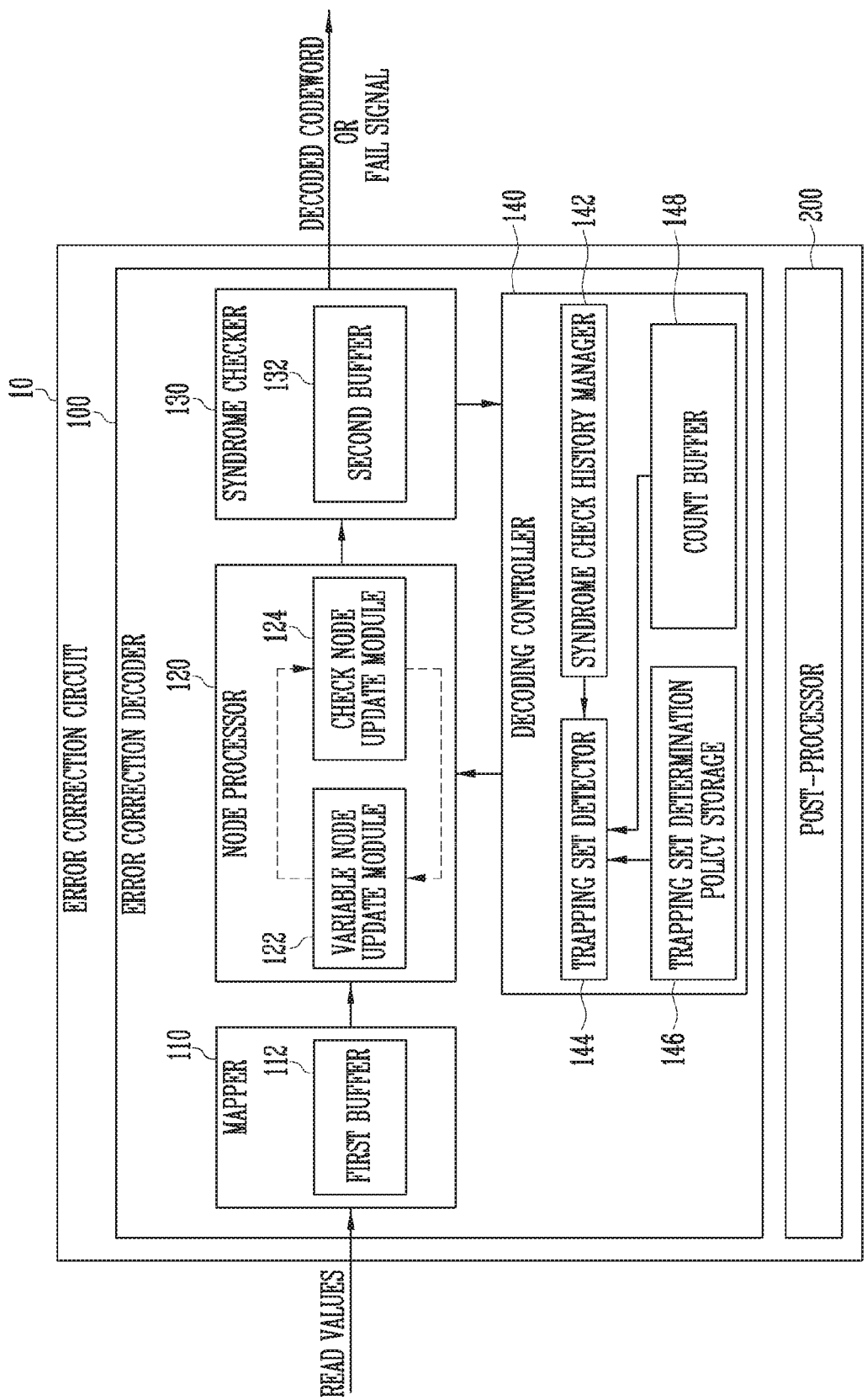
FIG. 1 is a diagram illustrating an error correction circuit based on an embodiment of the disclosed technology.

FIG. 1 is a diagram illustrating an error correction circuit based on an embodiment of the disclosed technology.

Referring to FIG. 1, an error correction circuit 10 based on an embodiment of the disclosed technology may include an error correction decoder 100 and a post-processor 200.

The error correction decoder 100 may perform error correction decoding using various algorithms that adopt an iterative decoding scheme. For example, the error correction decoder 100 may perform error correction decoding using a message passing algorithm (MPA) such as a "belief propagation algorithm (BPA)." Some error correction decoding algorithms can be viewed examples of a message passing algorithm if messages are passed among the nodes in the Tanner graph. The belief propagation algorithm is a message-passing algorithm for performing inference on graphical models.

The error correction decoder 100 may perform error correction decoding within the maximum number of iterations (i.e., the maximum iteration number) based on an iterative decoding scheme. When a valid codeword that satisfies constraints for a parity check matrix of an error correction code (ECC) is generated within the maximum iteration number, the error correction decoder 100 may output the generated valid codeword as a decoded codeword. When a valid codeword that satisfies the constraints for the parity check matrix of an error correction code is not generated after the maximum iteration number is reached, the error correction decoder 100 may declare a decoding failure by outputting a "fail" signal indicating that error correction decoding has failed. The error correction decoder 100 may use a low density parity check (LDPC) code as an error correction code (ECC). In some implementations of the disclosed technology, the constraints of the parity check matrix may include a certain equation that must be satisfied to declare a decoding success.

The error correction decoder 100 may include a mapper 110, a node processor 120, a syndrome checker 130, and a decoding controller 140. In an embodiment, at least one of the mapper 110, the syndrome checker 130, and the decoding controller 140 may be present outside the error correction decoder 100. In this patent document, the recitation of "at least one of A, B, and C" and "at least one of A, B, or C" should be interpreted as A, B, or C, or a combination of any two or more of A, B, and C with or without others.

The mapper 110 may receive read values from a channel. Read values are values that are read from a memory device. For example, a single read operation conducted over a memory location or cell may produce a binary value of either zero or one in a binary storage scheme. For example, the mapper 110 may receive read values corresponding to a single codeword from a memory device. Each of the read values may be "0" or "1." When hard-decision decoding is used, a single set of read values may correspond to a single codeword. The single set of read values may be referred to as a single read vector. When soft-decision decoding is used, a plurality of sets of read values may correspond to a single codeword. That is, when soft-decision decoding is used, a plurality of read vectors may correspond to a single codeword.

In some implementations, the channel may include a wired or wireless medium through which the read values are conveyed or a storage medium in which information is stored. In some implementations of the disclosed technology, the channel may include an interface that carries data between the error correction circuit 10 and a memory device, or may include the memory device itself.

The mapper 110 may generate quantized read values using the read values. For example, the mapper 110 may generate a (g+1) level quantized read vector using g read vectors. Each of read values included in the (g+1) level quantized read vector may be a (g+1) level quantized read value. The (g+1) level quantized read value may be a read pattern (e.g., a bit sequence) composed of g bits. For example, a 2-level quantized read value may be "1" or "0." For example, one of the 2-level quantized read value may be "1," and the other of the 2-level quantized read value may be "0." As another example, a 3-level quantized read value may be "11," "10," "01" or "00." For example, one of 3-level quantized read value may be "11," another of the 3-level quantized read value may be "00," and the rest of the 3-level quantized read value may be "10" or "01."

When soft-decision decoding is used (i.e., when g is equal to or greater than 2), the mapper 110 may generate a (g+1) level quantized read vector by combining read vectors corresponding to g read voltages. For example, when two read voltages (e.g., a first read voltage and a second read voltage) are used, the mapper 110 may generate a 3-level quantized read vector by combining a read vector corresponding to the first read voltage with a read vector corresponding to the second read voltage. For this operation, the mapper 110 may include a first buffer 112. When g read voltages are used, the first buffer 112 may receive and store read vectors respectively corresponding to the g read voltages. Therefore, the mapper 110 may generate a (g+1) level quantized read vector by combining the read vectors stored in the first buffer 112 in accordance with the g read voltages.

When hard-decision decoding is used (i.e., when g is 1), the mapper 110 may determine that a single received read vector itself is a 2-level quantized read vector.

The mapper 110 may convert the (g+1) level quantized read vector (the read vector quantized into g+1 levels) to an initial vector used for error correction decoding that conforms to an iterative decoding scheme, and may provide the initial vector to the node processor 120. The initial vector may include a plurality of initial values. That is, the mapper 110 may convert each of the (g+1) level quantized read values to an initial value. The initial values may be, for example, Log Likelihood Ratio (LLR) values.

The node processor 120 may perform error correction decoding based on the initial vector received from the mapper 110 within the maximum iteration number. The node processor 120 may perform error correction decoding using various algorithms which adopt an iterative decoding scheme. For example, the node processor 120 may perform error correction decoding using a message passing algorithm (MPA). By the way of example and not by limitation, as the message passing algorithm, a sum-product algorithm, a minimum (min)-sum algorithm or others may be used. In an example implementation of the MPA, messages in the form of probability vectors are passed among nodes in a graph where the iteration of the algorithm may be viewed as messages passing through the graph.

The MPA may generate an output converging to a correct estimate of the read values through iterations of exchange of messages between variable nodes and check nodes. The messages may include Variable to Check (V2C) messages that are sent from the variable nodes to the check nodes and Check to Variable (C2V) messages that are sent from the check nodes to the variable nodes. A combination of processes including a process of transmitting V2C messages from the variable nodes to the check nodes, a process of transmitting C2V messages from the check nodes to the variable nodes, and a process of updating values of the respective nodes through the respective processes may be referred to as one iteration.

The node processor 120 may include a variable node update module 122 and a check node update module 124.

The variable node update module 122 may initialize variable nodes using an initial vector, for example, LLR values, received from the mapper 110 before a first iteration is performed. That is, the variable node update module 122 may assign the initial values included in the initial vector to respective variable nodes one by one. The variable node update module 122 may generate V2C messages and send the V2C messages to the check node update module 124 in a first iteration so that initial values of respective variable nodes are transferred to check nodes coupled to the corresponding variable nodes. The variable node update module 122 may update the values of the variable nodes in response to the C2V messages received from the check node update module 124 in respective iterations. The variable node update module 122 may generate V2C messages based on the C2V messages, received from the check node update module 124, and send the generated V2C messages to the check node update module 124 in respective iterations except the first iteration.

The check node update module 124 may update the values of the check nodes in response to the V2C messages received from the variable node update module 122 in respective iterations. The check node update module 124 may generate C2V messages based on the V2C messages, received from the variable node update module 122, and send the generated C2V messages to the variable node update module 122 in respective iterations.

The initial values and the messages may be referred to as soft information. The soft information may include values expressed by an integer or real number. In an example implementation, the soft information may be a Log Likelihood Ratio (LLR) value. The soft information may include estimates of probability or some equivalent information representing that an estimate of each symbol belonging to a codeword is "0" or "1" and a confidence value (probability or likelihood) of each estimate. For example, the soft information may include a sign bit and a magnitude bit. The sign bit may represent an estimate of the corresponding symbol. For example, a sign bit representing a negative value may indicate that it is more likely that the corresponding symbol will be "1," and a sign bit representing a positive value makes it less likely that the corresponding symbol is "1." On the contrary, the sign bit representing the positive value may indicate that it is more likely that the corresponding symbol will be "0," and the sign bit representing the negative value makes it less likely that the corresponding symbol is "0." The magnitude bit may represent a confidence value (probability or likelihood) with respect to the sign bit. For example, when the value of the magnitude bit increases, the confidence value (probability or likelihood) with respect to the sign bit may increase.

The node processor 120 may repeat the iterations within the maximum iteration number I, and may provide the values of variable nodes (hereinafter referred to as a "variable node vector $C_i$") appearing as a result of performing an i-th iteration to the syndrome checker 130. Here, I is a natural number, and i is a natural number less than or equal to I. The variable node vector may be a row vector or a column vector. Below, in the description of the embodiments of the disclosed technology, the variable node vector is assumed to be a row vector.

When a codeword that satisfies the constraints of a parity check matrix of an error correction code is generated within the maximum iteration number I, that codeword can be said to be a valid codeword, the syndrome checker 130 may output the generated valid codeword as a decoded codeword. For example, the syndrome checker 130 may store the variable node vector $C_i$, received from the node processor 120 at the i-th iteration, in a second buffer 132, and may perform a syndrome check on the received variable node vector $C_i$. For example, the syndrome check may be performed by checking whether all symbols of a syndrome vector $S_i$ calculated by the following Equation (1) are "0." The syndrome vector $S_i$ can be expressed as:

$$S_i = H < C_i^T \qquad \text{Equation (1)}$$

Here, $S_i$ denotes a syndrome vector corresponding to the i-th iteration, H denotes the parity check matrix of the error correction code, and $C_i^T$ denotes a transposed matrix of the variable node vector $C_i$ corresponding to the i-th iteration.

In a case where all symbols of the syndrome vector $S_i$ are "0," it can be determined that the syndrome vector has passed the syndrome check. This means that error correction decoding has been successfully performed in the i-th iteration, and thus the syndrome checker 130 may output the variable node vector $C_i$, stored in the second buffer 132, as a decoded codeword.

In a case where there is at least one nonzero symbol among the symbols of the syndrome vector $S_i$, it can be determined that the syndrome check has failed. This means that error correction decoding has failed in the i-th iteration, and thus the node processor 120 may perform an (i+1)-th iteration when the number of iterations falls within the maximum iteration number I. Here, a check node corresponding to a symbol other than '0', among the symbols of the syndrome vector $S_i$, may be referred to as an "unsatisfied check node (UCN)". When the syndrome check corresponding to the i-th iteration fails, the syndrome checker 130 may notify the decoding controller 140 of the failure in the syndrome check. Here, the syndrome checker 130 may provide at least one of information about the number of UCNs and the syndrome vector corresponding to the i-th iteration to the decoding controller 140.

In a specific situation, there may occur a trapping set that hinders the error correction decoder 100 from converging to a valid codeword. Generally, it is known that, when a trapping set exists, error correction by the error correction decoder 100 is impossible even if a larger number of additional iterations are performed. That is, when the error correction decoder 100 converges to the trapping set, performing an additional iteration without further processing may result in a waste of resources even if the number of iterations falls within the maximum iteration number.

When the presence of a trapping set is checked within the maximum iteration number, the decoding controller 140 may control the node processor 120 so that an additional iteration is not performed, that is, so that iterative decoding of the current read values is stopped.

The decoding controller 140 may include a syndrome check history manager 142, a trapping set detector 144, a trapping set determination policy storage 146, and a count buffer 148.

The syndrome check history manager 142 may maintain a prior history of syndrome checks and keep track of changes to syndrome vectors. The prior history of syndrome checks may include at least one of the information about the number of UCNs and a syndrome vector.

In an embodiment, the syndrome check history manager 142 may receive information about the number of UCNs corresponding to each iteration from the syndrome checker 130. In this case, the syndrome checker 130 may calculate the number of UCNs included in a syndrome vector corresponding to each iteration, and may provide information about the number of UCNs to the syndrome check history manager 142.

In an embodiment, the syndrome check history manager 142 may receive a syndrome vector corresponding to each iteration from the syndrome checker 130. In an embodiment, the syndrome check history manager 142 may derive information about the number of UCNs from the syndrome vector received from the syndrome checker 130, instead of receiving the information about the number of UCNs corresponding to each iteration from the syndrome checker 130.

The syndrome check history manager 142 may store at least one of the information about the numbers of UCNs and syndrome vectors corresponding to the set number of iterations. The prior history of syndrome checks may include the result of previous syndrome check operations. In some implementations, the history of syndrome checks at each of a plurality of iterations is maintained. The prior history of syndrome checks may be maintained such that each group of record corresponds to a series of most recent iterations corresponding to a set number of iterations. For example, the prior history of syndrome checks may include at least one of a syndrome vector and information about the number of UCNs corresponding to the most iterations (e.g., the five most recent iterations).

The trapping set detector 144 may check whether there is a trapping set, based on the prior history of syndrome checks maintained by the syndrome check history manager 142 and a trapping set determination policy stored in the tapping set determination policy storage 146. That is, the trapping set detector 144 may detect a trapping set by applying the trapping set determination policy to the prior history of syndrome checks. In an embodiment, the trapping set detector 144 may apply the trapping set determination policy to the prior history of syndrome checks corresponding to each of the set number of most recent iterations, among a plurality of iterations.

As described above, it is known that, when there is a trapping set, error correction is impossible even if additional iterations are performed without further separate processing. Therefore, the trapping set detector 144 may check the presence of a trapping set, and may control the node processor 120 so that iterative decoding is stopped when the trapping set is detected. It can be said that a trapping set exists when certain criteria are met in an iterative decoding process. For example, it can be said that a trapping set exists, e.g., when a message does not change even after a predetermined number of decoding iterations or when a syndrome vector converges to a false direction although the message is changing.

When one or more criteria of the trapping set determination policy are satisfied in the current decoding iteration with respect to the current read values, the trapping set detector 144 may determine that the trapping set exists.

The trapping set determination policy may include various conditions that need to be met to determine that at least one trapping set exists. For example, the trapping set determination policy may include conditions related to information itself included in the prior history of syndrome checks or various types of information that may be estimated from the prior history of syndrome checks. For example, the trapping set determination policy may include conditions related to at least one of the following situations: a change in a syndrome vector; the number of UCNs; and a change in the number of UCNs. The trapping set determination policy may include at least one of a first policy and a second policy.

The first policy may include at least one condition. For example, the first policy may include conditions related to at least one of the presence or absence of a change in a syndrome vector corresponding to each of the set number of iterations, a relationship between the number of UCNs and a threshold value in each of the set number of iterations, the presence or absence of a change in the number of UCNs in each of the set number of iterations, and a change in the number of UCNs in each of the set number of iterations from the number of UCNs in a previous iteration.

The condition related to the relationship between the number of UCNs and a threshold value may include at least one of, for example, whether the number of UCNs is less than a threshold value in each of the set number of iterations and whether the number of UCNs is equal to the threshold value in each of the set number of iterations.

The condition related to the change in the number of UCNs from the number of UCNs in the previous iteration may include at least one of, for example, whether the number of UCNs has monotonically decreased in the set number of iterations, whether the number of UCNs in a current iteration has increased from the number of UCNs in an immediately previous iteration, and whether the number of UCNs in the current iteration is equal to the number of UCNs in the immediately previous iteration.

The second policy may include at least one condition. For example, the second policy may include conditions related to at least one of information about whether the number of UCNs in a current iteration is greater than the number of UCNs in the immediately previous iteration and information about whether the number of UCNs in the current iteration is equal to the number of UCNs in the immediately previous iteration.

In an embodiment, the trapping set detector 144 may apply the first policy with or without others. In an embodiment, when the prior history of syndrome checks indicates that the current read values has never satisfied any of the conditions included in the first policy, the trapping set detector 144 may apply the first policy, whereas when the prior history of syndrome checks indicates that the current read values has ever satisfied at least once any of the conditions included in the first policy, the trapping set detector 144 may apply the second policy. That is, the first policy may be applied to iterations before the trapping set detector 144 detects a trapping set, and once the trapping set detector 144 detects the trapping set, the second policy may be applied to iterations that start after detection of the trapping set.

In an embodiment, the trapping set detector 144 may determine that a trapping set exists when the total number of occasions that any condition included in the first policy is satisfied reaches a predetermined number. In an embodiment, the trapping set detector 144 may determine that a trapping set exists when any one of the conditions included in the first policy is satisfied at least once. In another embodiment, the trapping set detector 144 may determine that a trapping set exists when one or more of conditions included in the first policy are satisfied more than once.

When any of the conditions included in the first policy is satisfied at a predetermined number of iterations and a trapping set is determined to exist, the trapping set detector 144 may notify the post-processor 200 that the trapping set has occurred. Accordingly, the post-processor 200 may perform a predefined operation to eliminate the trapping set. For example, the post-processor 200 may support the error correction decoder 100 so that various types of parameters (e.g., an initial vector) used for error correction decoding are corrected and error correction decoding is performed using the corrected parameters. When the post-processor 200 is not provided, the trapping set detector 144 may terminate error correction decoding at a time at which the trapping set occurs.

In an embodiment, the trapping set detector 144 may determine that a trapping set exists when any of the conditions included in the second policy is satisfied for a predetermined number of successive iterations. In other words, the trapping set detector 144 may determine that a trapping set exists when the prior history of syndrome checks indicates that occasions that satisfy the second policy appear at a predetermined number of successive iterations. That is, unlike the above-described embodiment, when any of the conditions included in the first policy is satisfied for a predetermined number of successive iterations, it is highly likely a trapping set exists, and thus the second policy may be applied to confirm the presence of the trapping set.

For example, the trapping set detector 144 may increase a count value stored in the count buffer 148 by one (1) when any of the conditions included in the first policy is satisfied. When the count value is 1, the trapping set detector 144 may apply the second policy from the next iteration. Thereafter, the trapping set detector 144 may increase the count value by 1 whenever any of the conditions included in the second policy is satisfied. In an embodiment, when the count value exceeds a preset threshold value, the trapping set detector 144 may terminate error correction decoding. The reason for this is that it is highly unlikely that additional iterations of error correction decoding would be successful.

Whenever the count value is updated or when the count value reaches a preset value, the trapping set detector 144 may transfer the count value to the post-processor 200. The post-processor 200 may perform a predefined operation to eliminate the trapping set. For example, the post-processor 200 may support the error correction decoder 100 so that various types of parameters (e.g., an initial vector) used for error correction decoding are corrected or updated and error correction decoding is performed using the corrected or updated parameters. When the post-processor 200 is not provided, the trapping set detector 144 may terminate error correction decoding at a time at which the count value becomes "1."

The trapping set detector 144 may initialize the count value whenever error correction decoding is initiated for new read values, or may initiate the count value when any condition included in the trapping set determination policy is not satisfied for a predetermined number of successive iterations. For example, the trapping set detector 144 may initialize the count value when any condition included in the second policy is not satisfied for a predetermined number of successive iterations. In this case, the first policy may be applied to a next iteration. In other words, the trapping set detector 144 may apply the first policy to a next iteration when the prior history of syndrome checks indicates that occasions that satisfy the second policy does not appear for a predetermined number of successive iterations.

The trapping set determination policy storage 146 may store the trapping set determination policy, and may provide the trapping set determination policy to the trapping set detector 144.

The post-processor 200 may support the error correction decoder 100 so that the error correction decoder 100 can generate a valid codeword in a situation in which a trapping set exists. For example, the post-processor 200 may support the error correction decoder 100 so that various types of parameters used for error correction decoding are corrected or updated and error correction decoding is performed using the corrected or updated parameters. That is, the post-processor 200 may prevent the error correction decoder 100 from converging to the same trapping set as that in a previous iteration.

Figures 2, 3:
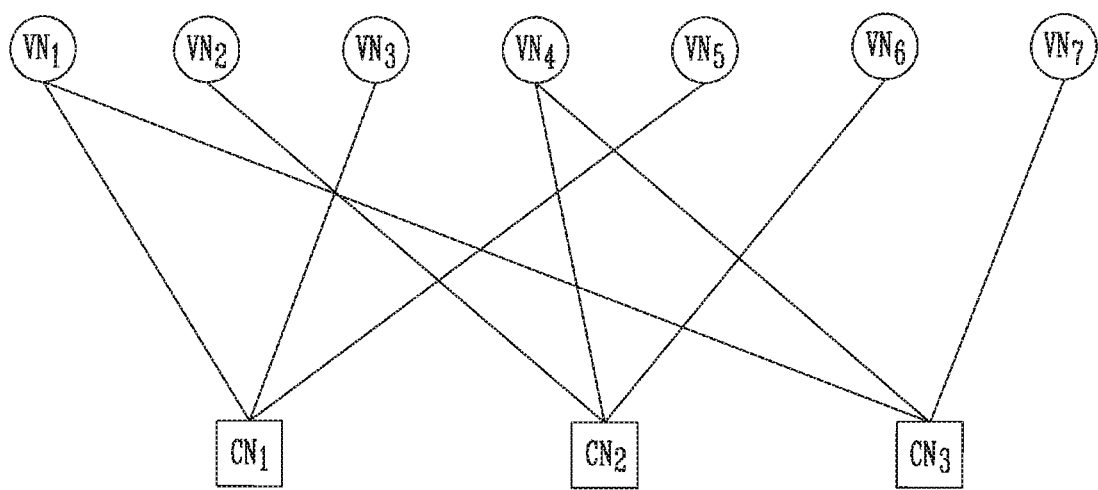
FIG. 2 is an example diagram illustrating a parity check matrix.
FIG. 3 is a diagram illustrating the parity check matrix of FIG. 2 as a Tanner graph.

FIG. 2 is an example diagram illustrating a parity check matrix.

In FIG. 2, an example of a parity check matrix H defining an (n, k) code is illustrated. The (n, k) code may be defined as a parity check matrix having a size of (n−k)×n. Each entry of the parity check matrix may be represented by "0" or "1," and the (n, k) code may be referred to as an "(n, k) LDPC code" when the number of 1s included in the parity check matrix is much less than the number of 0s. Here, n and k may be natural numbers. In FIG. 2, as an example, a parity check matrix defining a (7, 4) code is illustrated.

A matrix in which each entry is implemented as a sub-matrix may be referred to as a "base matrix." Each entry of the base matrix may be a sub-matrix having an m×m size. Here, m may be an integer of 2 or more. For example, zero (0) in the base matrix may indicate that the corresponding entry is a zero matrix, and nonzero (e.g., 1) in the base matrix may indicate that the corresponding entry is not a zero matrix. For example, when the base matrix is used for a Quasi Cyclic (QC)-LDPC code, "1" may indicate that the corresponding entry is a circulant matrix. The circulant matrix may be a matrix obtained by cyclically shifting an identity matrix by a predetermined shift value, and any one circulant matrix may have a shift value different from that of another circulant matrix.

FIG. 3 is a diagram illustrating the parity check matrix of FIG. 2 as a Tanner graph.

An (n, k) code may be represented by a Tanner graph which is a representation of an equivalent bipartite graph and includes two types of nodes. The Tanner graph may be represented by n–k check nodes, n variable nodes, and edges. The check nodes correspond to rows of the parity check matrix, and the variable nodes correspond to columns of the parity check matrix. Each edge couples one check node to one variable node, and indicates an entry represented by 1 in the parity check matrix.

The parity check matrix of the (7, 4) code illustrated in FIG. 2 may be represented by a Tanner graph including three check nodes $CN_1$ to $CN_3$ and seven variable nodes $VN_1$ to $VN_7$. Solid lines for coupling the check nodes $CN_1$ to $CN_3$ to the variable nodes $VN_1$ to $VN_7$ indicate edges.

Iterative decoding may be performed based on an iterative message passing algorithm between the check nodes $CN_1$ to $CN_3$ and the variable nodes $VN_1$ to $VN_7$ on the Tanner graph, as illustrated in FIG. 3. That is, in each iteration, iterative decoding may be performed while messages are transferred between the check nodes $CN_1$ to $CN_3$ and the variable nodes $VN_1$ to $VN_7$.

The variable nodes may perform error correction using C2V messages received from the check nodes coupled thereto. The variable nodes may generate V2C messages to be sent to the check nodes coupled thereto, and may send the generated V2C messages to the corresponding check nodes, respectively.

The check nodes may perform a parity check using V2C messages received from the variable nodes coupled thereto. In the parity check, sign bits included in the V2C messages may be used. The check nodes may generate C2V messages to be sent to the variable nodes coupled thereto, and may send the generated C2V messages to the corresponding variable nodes, respectively.

FIG. 4 is an example diagram for explaining a syndrome vector calculated using the parity check matrix illustrated in FIG. 2.

As described above, a syndrome vector $S_i$ may be generated based on a parity check matrix H and a transposed matrix $C_i^T$ of a variable node vector $C_i$ corresponding to an i-th iteration. The symbols $S_{i1}$, $S_{i2}$, and $S_{i3}$ of the syndrome vector $S_i$ correspond to respective check nodes $CN_1$ to $CN_3$ on the Tanner graph illustrated in FIG. 3.

A case where all of the symbols $S_{i1}$, $S_{i2}$, and $S_{i3}$ of the syndrome vector $S_i$ indicate zero (0) means that the syndrome vector Si has passed a syndrome check. This means that error correction decoding has been successfully performed in the corresponding iteration. Therefore, iterative decoding for the corresponding read values may be terminated, and the variable node vector $C_i$ corresponding to the i-th iteration may be output as a decoded codeword.

A case where at least one of the symbols $S_{i1}$, $S_{i2}$, and $S_{i3}$ of the syndrome vector $S_i$ is not '0' means that the syndrome check has failed. This means that error correction decoding has not succeeded in the corresponding iteration. Therefore, when the number of iterations does not reach the maximum iteration number, a next iteration may be performed. Here, a check node corresponding to the nonzero symbol may be called unsatisfied check node (UCN).

Figure 5:
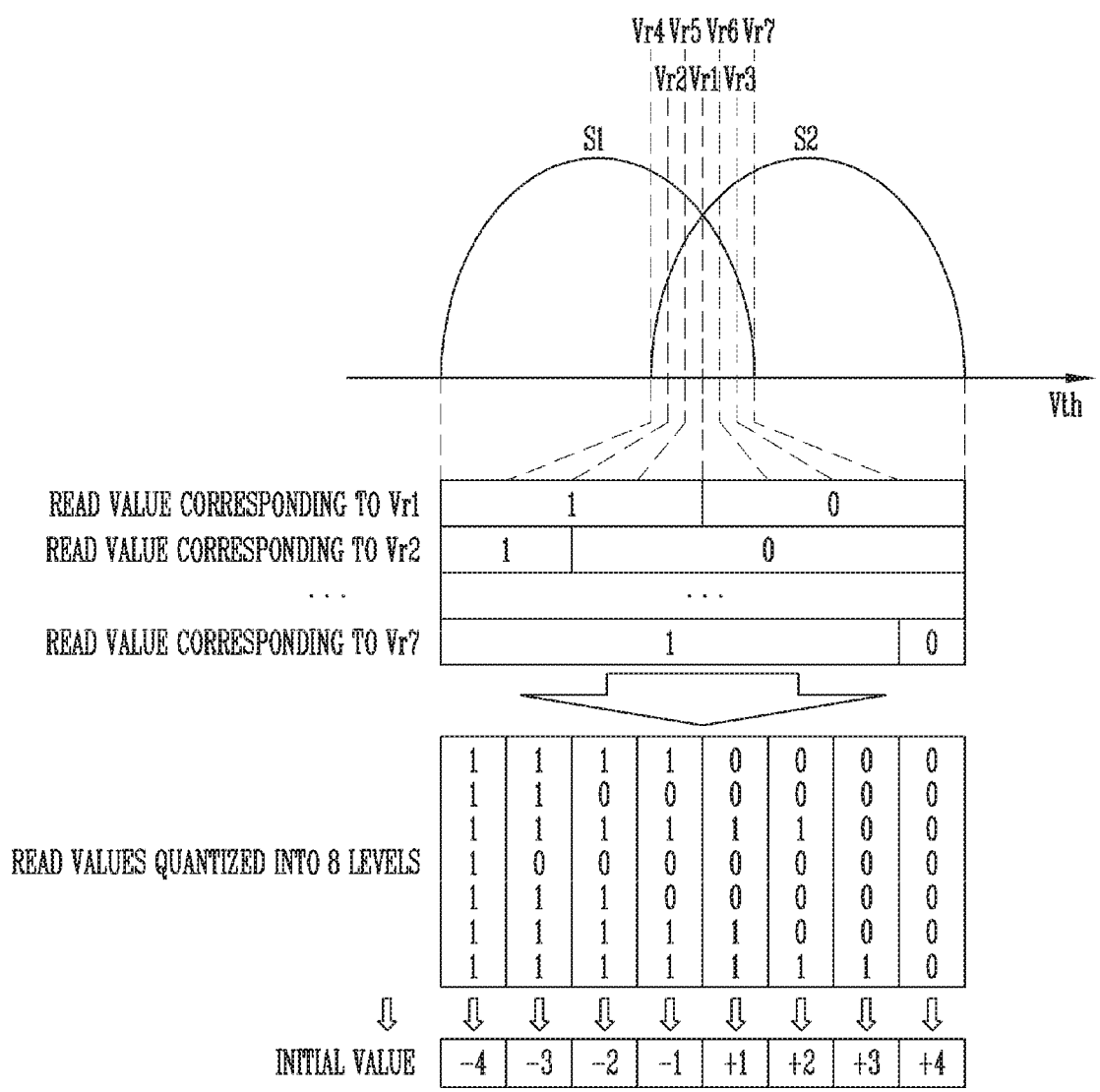
FIG. 5 is an example diagram for explaining a procedure for generating an initial value using g read values in soft decision decoding.

FIG. 5 is an example diagram for explaining a procedure for generating an initial value using g read values in soft-decision decoding.

In FIG. 5, threshold voltage (Vth) distributions of memory cells having any one of a first state S1 and a second state S2 are illustrated.

For n-bit multi-level cell NAND flash memory, the threshold voltage of each cell can be programmed to 2n possible values. In an ideal multi-level cell NAND flash memory, each value corresponds to a non-overlapping threshold voltage window (not shown in FIG. 5). In FIG. 5, the vertical axis indicates the number of memory cells that has a particular threshold voltage represented on the horizontal axis. Memory cells programmed to the same value have their threshold voltages fall into the same window, but their exact threshold voltages could be different. As program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using error correction codes (ECC).

When quantization level g+1 is used, g read voltages may be sequentially applied to a plurality of memory cells to acquire g read vectors corresponding to a single codeword. For example, as illustrated in FIG. 5, when quantization level 2 is used, one read voltage Vr1 may be applied, and when quantization level 3 is used, two read voltages Vr1 and Vr2 may be sequentially applied. Similarly, when quantization level 8 is used, seven read voltages Vr1, Vr2, Vr3, Vr4, Vr5, Vr6, and Vr7 may be sequentially applied. This means that, when quantization level g+1 is used, g read voltages may be applied to each memory cell, and thus g read values may be acquired from each memory cell.

When any one of the g read voltages is applied to the plurality of memory cells, a read value from a memory cell having a threshold voltage lower than the applied read voltage may appear as "1," and a read value from a memory cell having a threshold voltage higher than the applied read voltage may appear as "0." For example, as illustrated in FIG. 5, when seven read voltages Vr1, Vr2, Vr3, Vr4, Vr5, Vr6, and Vr7 are used, seven read values may be acquired from each memory cell.

The error correction circuit may generate a (g+1) level quantized read values by combining read values respectively corresponding to the g read voltages. For example, as illustrated in FIG. 5, when seven read voltages are used, the error correction circuit may generate an 8-level quantized read value by combining read values respectively corresponding to the seven read voltages.

The error correction circuit may convert or map the (g+1) level quantized read values into initial values (e.g., LLR values). Conversion or mapping into the initial values may be performed by referring to a set lookup table.

Figures 6, 7:
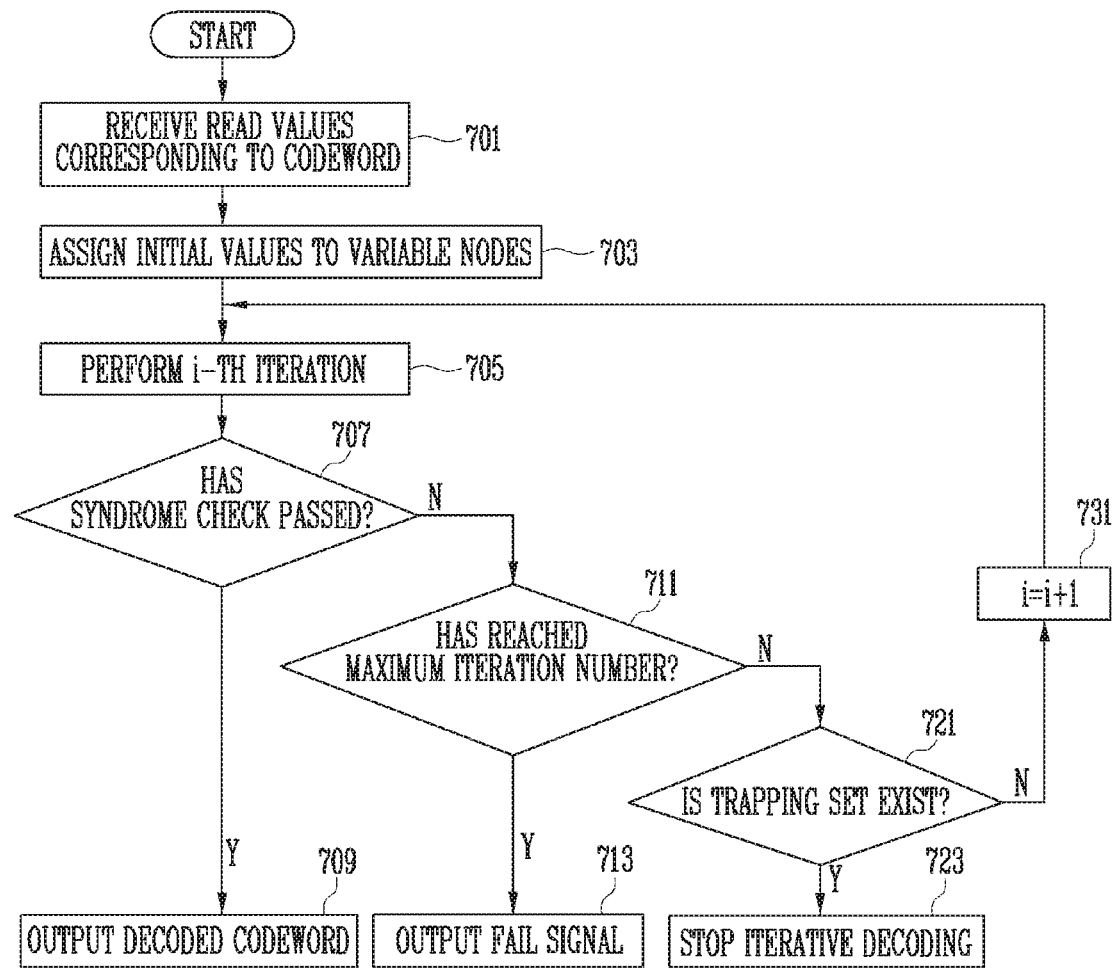
FIG. 6 is an example diagram illustrating a lookup table.
FIG. 7 is a flowchart illustrating a method of operating the error correction circuit of FIG. 1.

FIG. 6 is an example diagram illustrating a lookup table.

Referring to FIG. 6, the lookup table may define LLR values respectively corresponding to a plurality of quantization levels. As discussed above, the neighboring threshold voltage distributions may overlap, and the memory cells with threshold voltages that fall within the overlapping range of the neighboring distributions may be corrected by using the ECC such as an iterative decoding scheme. In some implementation, an initial value of the iterative decoding scheme is obtained by computing the log likelihood of the probability of falling in certain decision regions of the overlapping range of the neighboring threshold voltage distributions.

The error correction circuit may convert each of (g+1) level quantized read values, which are quantized into quantization level g+1, into any one of g+1 LLR values corresponding to the quantization level g+1, with reference to the lookup table.

In an implementation, where the number of quantization level is two, the error correction circuit may convert one of 2-level quantized read values into LLR value LLR1 and convert the other of the 2-level quantized read values into a LLR value LLR2. For example, "1" of the 2-level quantized read values may be converted into a LLR value of "−4" and "0" of the 2-level quantized read values may be converted into a LLR value of "+4"

FIG. 7 is a flowchart illustrating a method of operating the error correction circuit of FIG. 1.

At step 701, the error correction circuit may receive read values such as a read vector corresponding to a codeword.

At step 703, the error correction circuit may assign initial values to variable nodes. When g read vectors, each corresponding to a single codeword, are received, the error correction circuit may generate a (g+1) level quantized read vector. The memory controller may convert the (g+1) level quantized read vector into an initial vector. For example, the initial vector may consist of initial values each corresponding to each of a plurality of variable nodes. Each initial value may be an LLR value.

At step 705, the error correction circuit may perform an i-th iteration within a maximum iteration number I based on an iterative decoding scheme. In the i-th iteration, V2C messages and C2V messages may be exchanged, and thus the variable nodes and check nodes may be updated.

At step 707, the error correction circuit may perform a syndrome check corresponding to the i-th iteration.

When the syndrome check has passed, the error correction circuit may output a variable node vector in the i-th iteration as a decoded codeword at step 709. When the syndrome check has failed, the process may proceed to step 711.

At step 711, the error correction circuit may determine whether the number of iterations has reached the maximum iteration number I. When it is determined at step 711 that the number of iterations has reached the maximum iteration number I, the process may proceed to step 713. If the number of iterations has not reached the maximum iteration number I yet, the process may proceed to step 721.

At step 713, since the error correction circuit failed to generate a valid codeword despite the maximum number of iterations I, it may output a "fail" signal indicating that error correction decoding has failed.

At step 721, the error correction circuit may check whether a trapping set exists. When a trapping set occurs in the iterative decoding process, the error correction circuit may detect the trapping set. A detailed description of step 721 will be made later with reference to FIG. 8.

When it is determined at step 721 that the trapping set is detected, the error correction circuit may stop iterative decoding at step 723. Upon detection of the trapping set, the error correction circuit may stop error correction decoding even if the number of iterations has not yet reached the maximum iteration number I. When the trapping set is detected, various types of parameters used for error correction decoding are modified by the post-processor to go back to step 703 or step 705 and perform error correction decoding based on the modified parameters.

In contrast, when it is determined at step 721 that a trapping set is not detected, a next iteration may be performed at step 705 after step 731 has been performed.

FIG. 8 is a flowchart illustrating a trapping set detection process based on an embodiment of the disclosed technology.

The process may proceed to step 721a from step 711. At step 721a, the error correction circuit may manage or maintain the prior history of syndrome checks. For example, the error correction circuit may manage at least one of information about the number of UCNs and a syndrome vector. In an embodiment, each record in the prior history of syndrome checks may be maintained in accordance with a series of iterations corresponding to a set number of iterations that are most recently performed.

At step 721b, the error correction circuit may apply a trapping set determination policy on the prior history of syndrome checks. That is, the error correction circuit may determine whether the prior history of syndrome checks satisfies any of the conditions included in the trapping set determination policy. In an embodiment, the trapping set determination policy may include at least one of the first policy and the second policy. For example, when any of the condition included in the trapping set determination policy has never been satisfied during the iterative decoding of the current read values, the first policy may be applied, whereas when any condition included in the trapping set determination policy has ever been satisfied during the iterative decoding of the current read values, the second policy may be applied.

When it is determined at step 721b that the prior history of syndrome checks satisfies any of the conditions included in the trapping set determination policy, the process may proceed to step 721c, otherwise the process may proceed to step 731 of FIG. 7.

At step 721c, the error correction circuit may increase a count value by 1. As discussed above, the error correction circuit implemented based on some embodiments of the disclosed technology may be configured to keep track of the history of trapping set determinations. This is done by counting how many times the trapping set determination policy has been met. For example, this may be done by using a binary digital counter, and the count value may be stored in a memory circuit.

At step 721d, the error correction circuit may check whether the count value has reached a threshold value. When the count value has reached the threshold value, the process may proceed to step 723 of FIG. 7. That is, when the count value has reached the threshold value, iterative decoding may be stopped.

When the count value does not reach the threshold value, a next iteration may be performed after step 731 of FIG. 7 has been performed.

In an embodiment, steps 721c and 721d may be omitted. In this case, when the prior history of syndrome checks indicates that any of the conditions included in the first policy has been met at least once, step 723 of FIG. 7 may be performed, and thus iterative decoding may be stopped.

FIG. 9 is an example diagram illustrating a trapping set determination policy based on an embodiment of the disclosed technology.

As described above, the trapping set determination policy may include certain criteria or conditions used to detect a trapping set. For example, the trapping set determination policy may include criteria or conditions related to at least one of the specified items such as a change in a syndrome vector, the number of UCNs, and a change in the number of UCNs.

In FIG. 9, an example in which seven conditions are included in a first policy and one condition is included in a second policy is illustrated by way of example. In various other implementations, various combinations of the conditions related to a change in a syndrome vector, the number of UCNs, and a change in the number of UCNs may be included in the trapping set determination policy.

In an embodiment, some of the conditions illustrated in FIG. 9 may be selectively applied. For example, when a first condition, a second condition, a fourth condition, and a sixth condition, among the conditions illustrated in FIG. 9, are applied, a third condition, a fifth condition, and a seventh condition may not be applied. In contrast, when the third condition, the fifth condition, and the seventh condition, among the conditions illustrated in FIG. 9, are applied, the first condition, the second condition, the fourth condition, and the sixth condition may not be applied. Individual conditions will be described in detail below.

The first condition indicates a case where a syndrome vector does not change for $\alpha 1$ successive iterations. The premises underlying the determination based on the first condition is that, when the first condition is satisfied, it is highly unlikely that additional iterations of error correction decoding would be successful.

The second condition indicates a case where the numbers of UCNs are less than a predetermined number $\beta 1$ for $\alpha 2$ successive iterations, where the number of UCNs in a current iteration is greater than the number of UCNs in the immediately previous iteration, and where the syndrome vector does not change for at least once during $\alpha 2$ successive iterations. The premises underlying the determination based on the second condition is that, when the second condition is satisfied, it is highly unlikely that additional iterations of error correction decoding would be successful.

The third condition indicates a case where the numbers of UCNs are less than or equal to the predetermined number $\beta 1$ for $\alpha 1$ successive iterations and where the number of UCNs in the current iteration is equal to or greater than the number of UCNs in the immediately previous iteration. The premises underlying the determination based on the third condition is that, when the third condition is satisfied, it is highly unlikely that additional iterations of error correction decoding would be successful.

The fourth condition indicates a case where the numbers of UCNs are less than the predetermined number $\beta 1$ for $\alpha 2$ successive iterations and where the numbers of UCNs stay unchanged for $\alpha 2$ successive iterations. The premises underlying the determination based on the fourth condition is that, when the fourth condition is satisfied, it is highly unlikely that additional iterations of error correction decoding would be successful.

The fifth condition indicates a case where the numbers of UCNs are less than a predetermined number $\beta 2$ for $\alpha 2$ successive iterations and where the numbers of UCNs stay unchanged for $\alpha 2$ successive iterations. The premises underlying the determination based on the fifth condition is that, when the fifth condition is satisfied, it is highly unlikely that additional iterations of error correction decoding would be successful.

The sixth condition indicates a case where the numbers of UCNs are less than the predetermined number $\beta 1$ for $\alpha 3$ successive iterations and where the number of UCNs is not monotonously decreased for $\alpha 3$ successive iterations. The premises underlying the determination based on the sixth condition is that, when the sixth condition is satisfied, it is highly unlikely that additional iterations of error correction decoding would be successful.

The seventh condition indicates a case where the numbers of UCNs are less than the predetermined number $\beta 2$ for $\alpha 3$ successive iterations and where the number of UCNs is not monotonously decreased for $\alpha 3$ successive iterations. The premises underlying the determination based on the seventh condition is that, when the seventh condition is satisfied, it is highly unlikely that additional iterations of error correction decoding would be successful.

Even if the first to seventh conditions are satisfied, the messages in an iterative decoding process can be updated. In this case, since there is a possibility of successfully completing error correction decoding by performing an additional iteration, $\alpha 1$, $\alpha 2$, $\alpha 3$, $\beta 1$, and $\beta 2$ may be experimentally determined in consideration of such a possibility. In an embodiment, $\alpha 2$ may be set to a value that is greater than $\alpha 1$ but less than $\alpha 3$. In an embodiment, $\beta 1$ may be set to a value less than $\beta 2$.

The eighth condition indicates a case where the number of UCNs in the current iteration is equal to or greater than the number of UCNs in the immediately previous iteration. The premises underlying the determination based on the eighth condition is that, when the number of UCNs in the current iteration is equal to or greater than the number of UCNs in the immediately previous iteration in a state in which at least one of the conditions included in the first policy is satisfied, it is highly unlikely that additional iterations of error correction decoding would be successful.

FIG. 10 is an example diagram for explaining a case where the first condition illustrated in FIG. 9 is satisfied.

In FIG. 10, a syndrome vector is depicted as contents of a table indicating the prior history of syndrome check corresponding to iterations ranging from an i-th iteration, which is an iteration currently being performed, to an (i–4)-th iteration, which is a fourth-previous iteration.

Assuming that $\alpha 1$ is 3 in the first condition illustrated in FIG. 9, the first condition indicates a case where the syndrome vector does not change in three successive iterations.

The prior history of syndrome checks illustrated in FIG. 10 represents that a syndrome vector of {1 0 0 0 1} is not updated in the three most recent iterations (i, i–1, i–2).

Therefore, assuming that $\alpha 1$ is 3, the prior history of syndrome checks illustrated in FIG. 10 satisfies the first condition illustrated in FIG. 9.

FIG. 11 is an example diagram for explaining a case where the second condition illustrated in FIG. 9 is satisfied.

In FIG. 11, a syndrome vector and information about the number of UCNs are depicted as contents of a table indicating the prior history of syndrome check corresponding to iterations ranging from an i-th iteration, which is an iteration currently being performed, to an (i–4)-th iteration, which is a fourth-previous iteration.

Assuming that both $\alpha 2$ and $\beta 1$ are 4 in the second condition illustrated in FIG. 9, the second condition indicates a case where the numbers of UCNs are less than 4 in four successive iterations, where the syndrome vector does not change at least once in four successive iterations, and where the number of UCNs in the current iteration is greater than the number of UCNs in the immediately previous iteration.

The prior history of syndrome checks illustrated in FIG. 11 represents that the numbers of UCNs are less than 4 in the four most recent iterations (i, i–1, i–2, i–3). Further, the prior history of syndrome checks represents that a syndrome vector of {1 0 0 0 1} in an (i–2)-th iteration is identical to a syndrome vector of {1 0 0 0 1} in an (i−1)-th iteration. That is, this shows that the syndrome vector has not changed in the (i−1)-th iteration. Also, the prior history of syndrome checks represents that the number of UCNs (=3) in the current iteration (i) is greater than the number of UCNs (=2) in the immediately previous iteration (i−1).

Therefore, assuming that both α2 and β1 are 4, the prior history of syndrome checks illustrated in FIG. 11 satisfies the second condition illustrated in FIG. 9.

FIG. 12 is an example diagram illustrating a case where the third condition illustrated in FIG. 9 is satisfied.

In FIG. 12, information about the number of UCNs is depicted as the prior history of syndrome checks corresponding to the iterations ranging from an i-th iteration, which is an iteration currently being performed, to an (i−4)-th iteration, which is a fourth-previous iteration.

Assuming that both α1 and β1 are 4 in the third condition illustrated in FIG. 9, the third condition indicates a case where the numbers of UCNs are less than 4 in four successive iterations and where the number of UCNs in a current iteration is equal to or greater than the number of UCNs in an immediately previous iteration.

The prior history of syndrome checks illustrated in FIG. 12 represents that the numbers of UCNs are less than 4 in the four most recent iterations (i, i−1, i−2, i−3). Also, the prior history of syndrome checks represents that the number of UCNs (=2) in the current iteration (i) is equal to the number of UCNs (=2) in the immediately previous iteration (i−1).

Therefore, assuming that both α1 and β1 are 4, the prior history of syndrome checks illustrated in FIG. 12 satisfies the third condition illustrated in FIG. 9.

FIG. 13 is an example diagram for explaining a case where the fourth condition or the fifth condition illustrated in FIG. 9 is satisfied.

In FIG. 13, information about the number of UCNs is depicted as contents of a table indicating the prior history of syndrome checks corresponding to iterations ranging from an i-th iteration, which is an iteration currently being performed, to an (i−4)-th iteration, which is a fourth-previous iteration.

Assuming that both α2 and β1 are 4 in the fourth condition illustrated in FIG. 9, the fourth condition indicates a case where the numbers of UCNs are less than 4 in four successive iterations and the numbers of UCNs are equal to each other in four successive iterations.

Assuming that α2 is 4 and β2 is 5 in the fifth condition illustrated in FIG. 9, the fifth condition indicates a case where the numbers of UCNs are less than 5 in four successive iterations and the numbers of UCNs are equal to each other in the four successive iterations.

The prior history of syndrome checks illustrated in FIG. 13 represents that the numbers of UCNs (=3) are equal to each other in the four most recent iterations (i, i−1, i−2, i−3).

Therefore, assuming that both α2 and β1 are 4, the prior history of syndrome checks illustrated in FIG. 13 satisfies the fourth condition illustrated in FIG. 9, and assuming that α2 is 4 and β2 is 5, the prior history of syndrome checks illustrated in FIG. 13 satisfies the fifth condition illustrated in FIG. 9.

FIG. 14 is an example diagram for explaining a case where the sixth condition or the seventh condition illustrated in FIG. 9 is satisfied.

In FIG. 14, information about the number of UCNs is depicted as contents of a table indicating the prior history of syndrome checks corresponding to iterations ranging from an i-th iteration, which is an iteration currently being performed, to an (i−4)-th iteration, which is a fourth previous iteration.

Assuming that α3 is 5 and β1 is 4 in the sixth condition illustrated in FIG. 9, the sixth condition indicates a case where the numbers of UCNs are less than 4 for the past five successive iterations and the number of UCNs is not monotonously decreased for five successive iterations.

Assuming that α3 is 5 and β2 is 5 in the seventh condition illustrated in FIG. 9, the seventh condition indicates a case where the numbers of UCNs are less than 5 for the past five successive iterations and the number of UCNs is not monotonously decreased for five successive iterations.

The prior history of syndrome checks illustrated in FIG. 14 represents that all of the numbers of UCNs are less than 4 in the five most recent iterations (i, i−1, i−2, i−3, i−4). Further, the prior history of syndrome checks represents that the number of UCNs in the (i−1)-th iteration is 1 and the number of UCNs in the i-th iteration is 2. That is, the prior history of syndrome checks represents that the number of UCNs has not monotonously decreased between the (i−1)-th iteration and the i-th iteration.

Therefore, assuming that α3 is 5 and β1 is 4, the prior history of syndrome checks illustrated in FIG. 14 satisfies the sixth condition illustrated in FIG. 9, and assuming that α3 is 5 and β2 is 5, the prior history of syndrome checks illustrated in FIG. 14 satisfies the seventh condition illustrated in FIG. 9.

FIG. 15 is an example diagram illustrating a case where the eighth condition illustrated in FIG. 9 is satisfied.

In FIG. 15, information about the number of UCNs is depicted as contents of a table indicating the prior history of syndrome checks corresponding to iterations ranging from an i-th iteration, which is an iteration currently being performed, to an (i−4)-th iteration, which is a fourth-previous iteration.

The eighth condition illustrated in FIG. 9 indicates a case where the number of UCNs in a current iteration (i) is greater than the number of UCNs in an immediately previous iteration (i−1).

The prior history of syndrome checks illustrated in FIG. 15 represents that the number of UCNs in the current iteration (i) is 3 and the number of UCNs in the immediately previous iteration (i−1) is 2. That is, the prior history of syndrome checks shows that the number of UCNs in the current iteration (i) is greater than the number of UCNs in the immediately previous iteration (i−1).

Therefore, the prior history of syndrome checks illustrated in FIG. 15 satisfies the eighth condition illustrated in FIG. 9.

Figure 16:
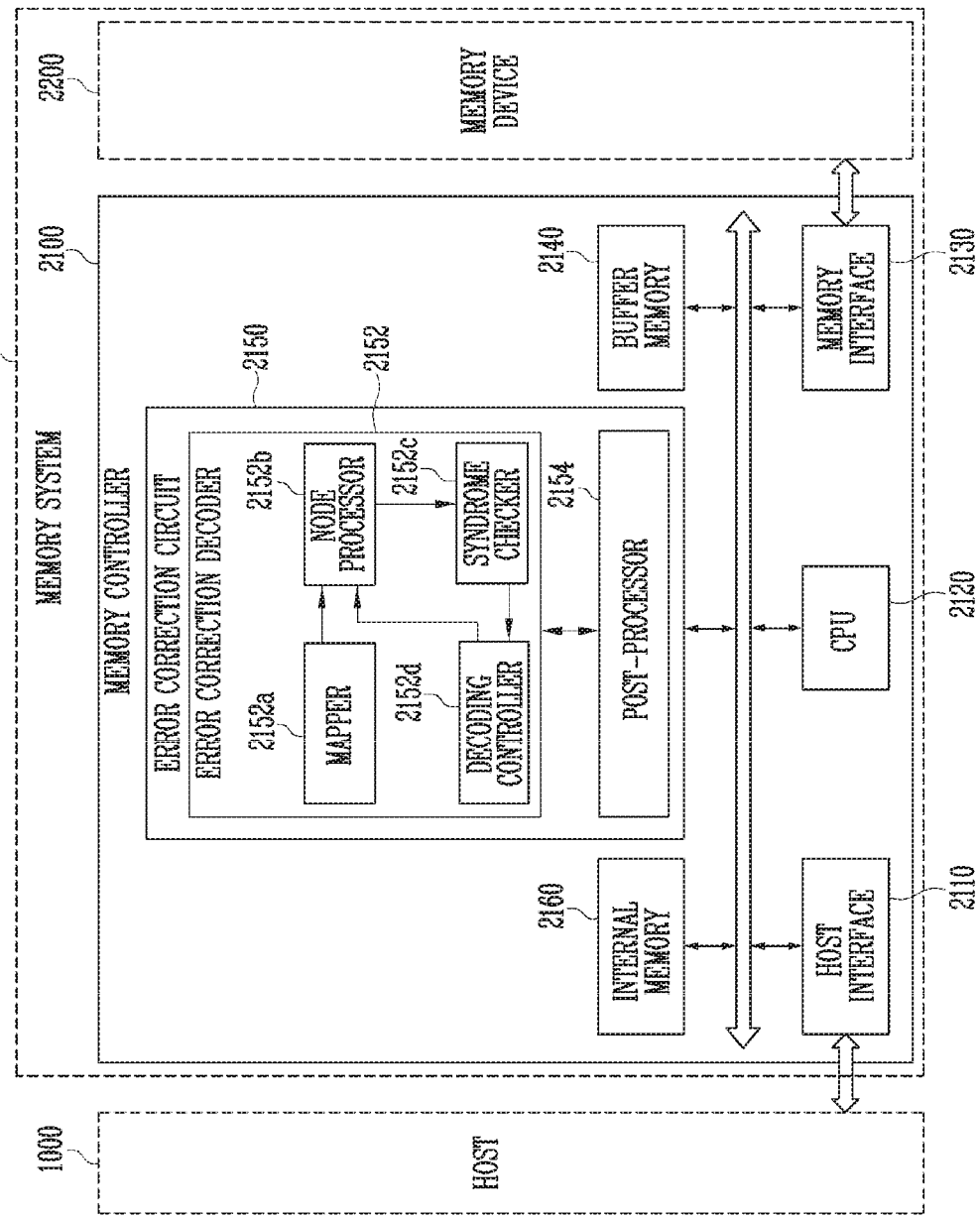
FIG. 16 is a diagram illustrating a memory system based on an embodiment of the disclosed technology.

FIG. 16 is a diagram illustrating a memory system based on an embodiment of the disclosed technology.

Referring to FIG. 16, a memory system 2000 may include a memory device 2200 which stores data, and a memory controller 2100 which controls the memory device 2200 under a request of a host 1000.

The host 1000 may communicate with the memory system 2000 using at least one of interface protocols such as Peripheral Component Interconnect-Express (PCI-E), Advanced Technology Attachment (ATA), Serial ATA (SATA), Parallel ATA (PATA), Universal Serial Bus (USB), Multi-Media Card (MMC), Enhanced Small Disk Interface (ESDI), Integrated Drive Electronics (IDE), Mobile Industry Processor Interface (MIPI), Universal Flash Storage (UFS), Small Computer Small Interface (SCSI), and serial attached SCSI (SAS). The host 1000 can be a device or a system that includes one or more computer processors which operate to retrieve digital information or data from the memory system 2000 or store or write digital information or data into the memory system 2000. In various applications, the host 1000 can be in various forms, including, for example, a personal computer (PC), a portable digital device, a tablet PC, a digital camera, a digital audio player, a digital multimedia player, a television, a wireless communication device, a cellular phone, console video game hardware, or a digital set-top box.

The memory controller 2100 may control the overall operation of the memory system 2000, and may control data exchange between the host 1000 and the memory device 2200. For example, the memory controller 2100 may convert received information and store and output the converted information so that commands, addresses, and data may be transmitted/received between the host 1000 and the memory device 2200. For example, during a program operation, the memory controller 2100 may transmit commands, addresses, data, etc. to the memory device 2200. For example, during a read operation, the memory controller 2100 may transmit commands, addresses, etc., to the memory device 2200, and may receive read values from the memory device 2200.

The memory controller 2100 may include a host interface 2110, a Central Processing Unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may perform data exchange with the host 1000 using a communication protocol.

The CPU 2120 may perform various types of calculations or generate commands and addresses so as to control the memory device 2200. For example, the CPU 2120 may generate various commands required for a program operation, a read operation, an erase operation, a data compression operation, and copy-back operations.

The memory interface 2130 may communicate with the memory device 2200 using a communication protocol.

The buffer memory 2140 may temporarily store data while the memory controller 2100 controls the memory device 2200. For example, until the program operation is completed, data received from the host may be temporarily stored in the buffer memory 2140. Further, during the read operation, data read from the memory device 2200 may also be temporarily stored in the buffer memory 2140.

The error correction circuit 2150 may perform encoding and decoding for error correction during the program operation or the read operation.

The error correction circuit 2150 may include an error correction decoder 2152 and a post-processor 2154. The error correction decoder 2152 may perform error correction decoding on read values that is data read from the memory device 2200. The error correction decoder 2152 may correct an error using a parity check matrix when an error is detected in an iterative decoding process for error correction. For example, the error correction decoder 2152 may calculate a syndrome vector based on the parity check matrix, and may determine, based on the calculated syndrome vector, whether an error exists. The error correction decoder 2152 may correct the error and output error-corrected data when the error contained in the read values is correctable. The error correction decoder 2152 may notify the CPU 2120 that decoding has failed when the error contained in the read values is not correctable.

The error correction decoder 2152 may include a mapper 2152*a*, a node processor 2152*b*, a syndrome checker 2152*c*, and a decoding controller 2152*d*. The error correction decoder 2152 may perform the same operation as the error correction decoder 100, described above with reference to FIG. 1. That is, the mapper 2152*a*, the node processor 2152*b*, the syndrome checker 2152*c*, and the decoding controller 2152*d* illustrated in FIG. 16 may perform operations respectively corresponding to the mapper 110, the node processor 120, the syndrome checker 130, and the decoding controller 140 illustrated in FIG. 1.

The post-processor 2154 may perform an operation corresponding to the post-processor 200 illustrated in FIG. 1.

The internal memory 2160 may be used as a storage which stores various types of information required for the operation of the memory controller 2100. The internal memory 2160 may store a plurality of tables. For example, the internal memory 2160 may store a mapping table for mapping between logical addresses and physical addresses.

The memory device 2200 may perform a program operation, a read operation, an erase operation, a data compression operation, and copy-back operations under the control of the memory controller 2100. The memory device 2200 may be implemented as a volatile memory device in which stored data is lost when the supply of power is interrupted or as a nonvolatile memory device in which stored data is retained even when the supply of power is interrupted.

Figure 17:
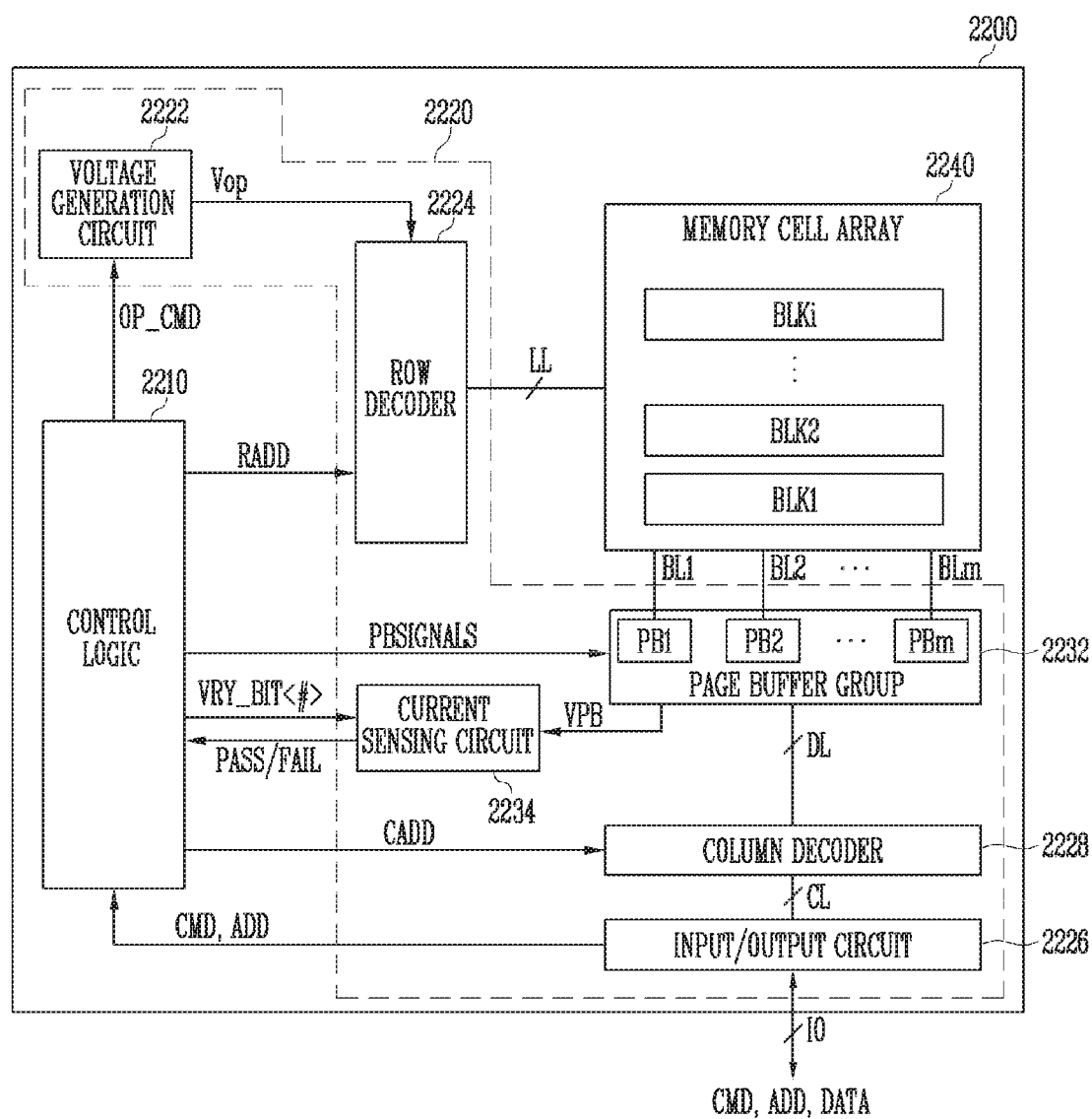
FIG. 17 is a diagram illustrating a memory device based on an embodiment of the disclosed technology.

FIG. 17 is a diagram illustrating a memory device based on an embodiment of the disclosed technology. The memory device illustrated in FIG. 17 may be applied to the memory system of FIG. 16.

The memory device 2200 may include a control logic 2210, peripheral circuits 2220 and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 16.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PB SIGNALS, and an enable bit VRY_BIT<#> in response to the command CMD and the address ADD. The control logic 2210 may determine whether a "verify" operation is successful (whether a target memory cell has passed or failed a program verification) in response to a "pass" or "fail" signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 18:
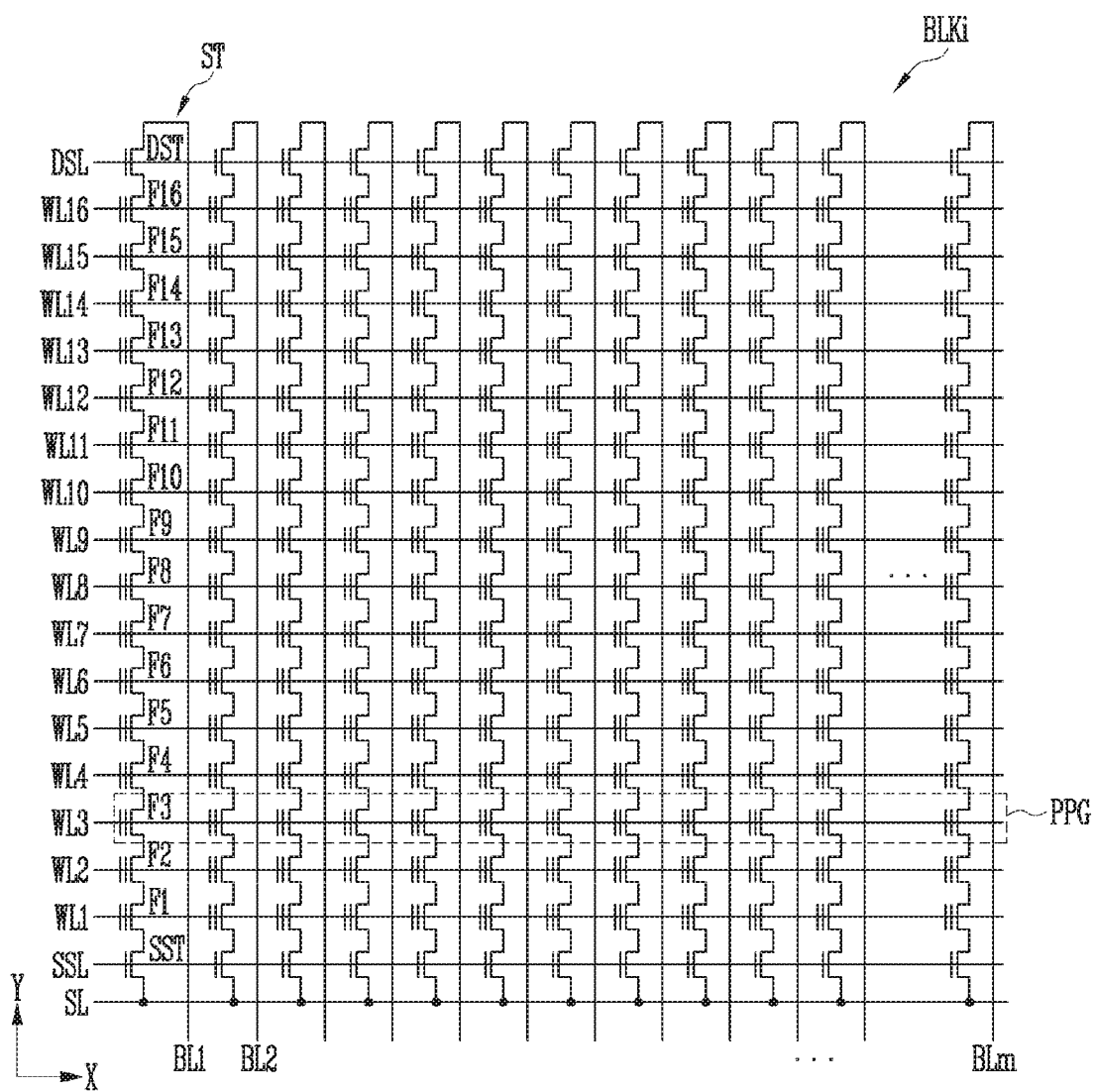
FIG. 18 is a diagram illustrating a memory block.

FIG. 18 is a diagram illustrating an example of a memory block.

A memory cell array may include a plurality of memory blocks, and any one memory block BLKi of the plurality of memory blocks is illustrated in FIG. 18 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

One memory cell may store one bit of data. This cell is called a single-level cell (SLC). Here, one physical page PPG may store data corresponding to one logical page LPG. The data corresponding to one logical page LPG may include a number of data bits identical to the number of cells included in one physical page PPG. For example, when two or more bits of data are stored in one memory cell, one physical page PPG may store data corresponding to two or more logical pages LPG. For example, in a memory device driven in an MLC type, data corresponding to two logical pages may be stored in one physical page PPG. In a memory device driven in a TLC type, data corresponding to three logical pages may be stored in one physical page PPG.

Figure 19:
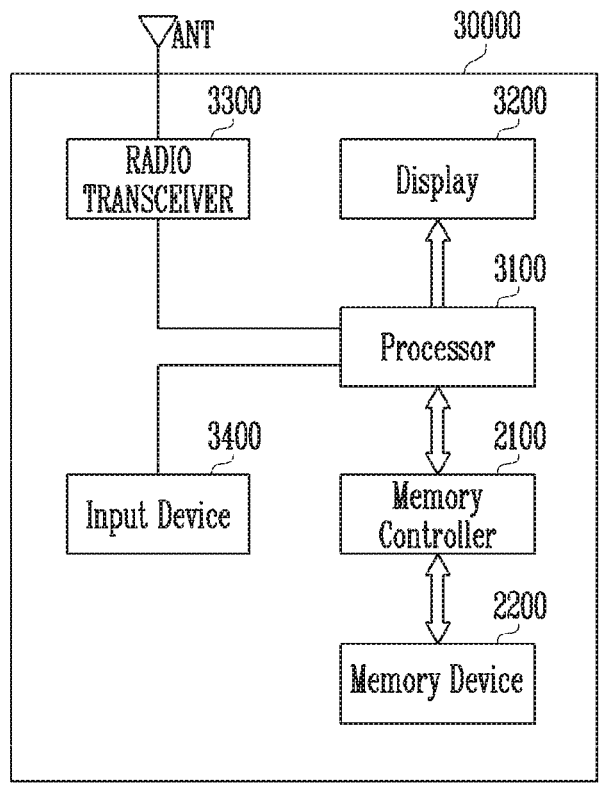
FIGS. 19 and 20 are diagrams illustrating embodiments of a memory system including a memory controller of FIG. 16.

FIG. 19 is a diagram illustrating an embodiment of a memory system including the memory controller of FIG. 16.

Referring to FIG. 19, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 20:
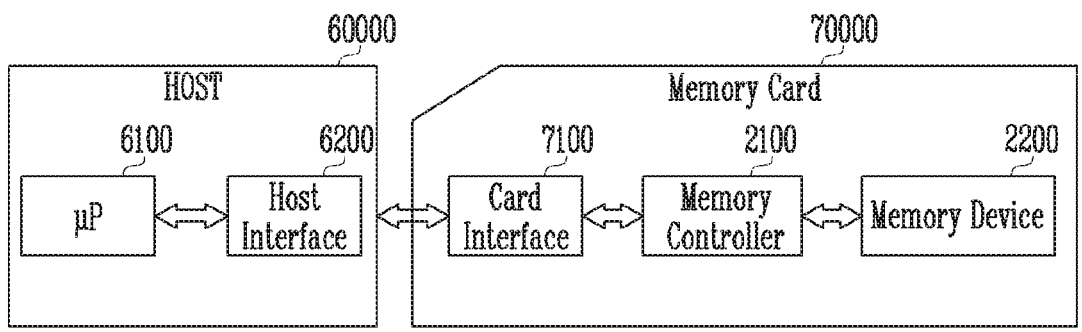

FIG. 20 is a diagram illustrating an embodiment of a memory system including the memory controller of FIG. 16.

Referring to FIG. 20, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor (g) 6100.

By implementing the technology disclosed in the disclosed technology, the performance of error correction decoding may be improved by detecting a trapping set while performing error correction decoding.

Some of the components of the disclosed devices or modules can be implemented as hardware, software, or combinations thereof. For example, a hardware implementation of electronic components can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate.

While the exemplary embodiments of the disclosed technology have been disclosed for illustrative purposes, those skilled in the art will appreciate that various modifications, additions and substitutions are possible. Therefore, the scope of the disclosed technology must be defined by the appended claims and equivalents of the claims rather than by the description preceding them.

What is claimed is:

1. An error correction circuit for performing error correction decoding based on an iterative decoding scheme, comprising:
    a syndrome check history manager configured to maintain a history of syndrome checks corresponding to one or more iterations of the iterative decoding scheme; and
    a trapping set detector configured to check a trapping set using a trapping set determination policy and the history of syndrome checks while the error correction decoding is performed,
    wherein the trapping set determination policy is related to at least one of a change in a syndrome vector, a number of unsatisfied check nodes (UCNs), or a change in the number of UCNs,
    wherein the trapping set determination policy comprises a first policy to be applied to iterations before the trapping set detector detects the trapping set, among the one or more iterations, and a second policy to be applied to iterations after the trapping set detector has detected the trapping set, among the one or more iterations, and
    wherein the trapping set detector is configured to check whether the trapping set exists when, among the history of syndrome checks corresponding to the one or more iterations, one or more occasions that the history of syndrome checks corresponding to the second policy appears at a predetermined number of successive iterations.

2. The error correction circuit according to claim 1, wherein the history of syndrome checks is stored in the syndrome check history manager based on at least one of a syndrome vector corresponding to each of the one or more iterations of the iterative decoding scheme or information about the number of UCNs corresponding to each of the one or more iterations of the iterative decoding scheme.

3. The error correction circuit according to claim 1, wherein the trapping set detector is configured to check the trapping set using the trapping set determination policy and the history of syndrome checks corresponding to a set number of iterations that are most recently performed, among the one or more iterations.

4. The error correction circuit according to claim 1, wherein the trapping set determination policy comprises conditions related to at least one of presence or absence of a change in a syndrome vector corresponding to each of a set number of iterations, a relationship between the number of UCNs and a threshold value in each of the set number of iterations, presence or absence of a change in the number of UCNs in each of the set number of iterations, or a change in the number of UCNs in each of the set number of iterations from the number of UCNs in a previous iteration.

5. The error correction circuit according to claim 4, wherein the trapping set detector is configured to determine that the trapping set exists when any one of the conditions included in the trapping set determination policy is satisfied at least once.

6. The error correction circuit according to claim 4, wherein the condition related to the relationship between the number of UCNs and the threshold value comprises at least one of information about whether the number of UCNs is less than the threshold value in each of the set number of iterations or information about whether the number of UCNs is equal to the threshold value in each of the set number of iterations.

7. The error correction circuit according to claim 4, wherein the condition related to the change from the number of UCNs in the previous iteration comprises at least one of information about whether the number of UCNs has decreased for the set number of iterations, information about whether the number of UCNs in a current iteration has increased from the number of UCNs in an immediately previous iteration, or information about whether the number of UCNs in the current iteration is equal to the number of UCNs in the immediately previous iteration.

8. The error correction circuit according to claim 1, wherein the first policy comprises conditions related to at least one of presence or absence of a change in a syndrome vector corresponding to each of a set number of iterations, a relationship between the number of UCNs and a threshold value in each of the set number iterations, presence or absence of a change in the number of UCNs in each of the set number of iterations, and a change in the number of UCNs in each of the set number of iterations from the number of UCNs in a previous iteration.

9. The error correction circuit according to claim 8, wherein the condition related to the relationship between the number of UCNs and the threshold value comprises at least one of information about whether the number of UCNs is less than the threshold value in each of the set number of iterations or information about whether the number of UCNs is equal to the threshold value in each of the set number of iterations.

10. The error correction circuit according to claim 8, wherein the condition related to the change from the number of UCNs in the previous iteration comprises at least one of information about whether the number of UCNs has decreased for the set number of iterations, information about whether the number of UCNs in a current iteration has increased from the number of UCNs in an immediately previous iteration, or information about whether the number of UCNs in the current iteration is equal to the number of UCNs in the immediately previous iteration.

11. The error correction circuit according to claim 1, wherein the second policy comprises a condition related to whether the number of UCNs in a current iteration is equal to or greater than the number of UCNs in an immediately previous iteration.

12. The error correction circuit according to claim 1, wherein the trapping set detector is configured to apply the first policy to a next iteration when, among the history of syndrome checks corresponding to the one or more iterations, the history of syndrome checks corresponding to the second policy does not appear for the predetermined number of successive iterations.

13. The error correction circuit according to claim 1, wherein the trapping set detector is configured to stop the error correction decoding when it is determined that the trapping set exists within a maximum iteration number.

14. The error correction circuit according to claim 1, wherein the error correction decoding is error correction decoding based on a low density parity check (LDPC) code.

15. A method of operating an error correction circuit, the error correction circuit performing error correction decoding based on an iterative decoding scheme, the method comprising:

storing a history of syndrome checks corresponding to one or more iterations of the iterative decoding scheme;
applying a trapping set determination policy to the history of syndrome checks, while the error correction decoding is performed, to check whether the history of syndrome checks meets criteria of the trapping set determination policy; and
when the history of syndrome checks meets the criteria of the trapping set determination policy within a maximum iteration number, stopping the error correction decoding,
wherein the error correction decoding is performed using an initial vector, and
wherein the criteria of the trapping set determination policy include at least one of a change in a syndrome vector, a number of unsatisfied check nodes (UCNs), or a change in the number of UCNs.

16. The method according to claim 15, wherein criteria of the history of syndrome checks comprise at least one of a syndrome vector corresponding to each of the one or more iterations or information about the number of UCNs corresponding to each of the one or more iterations.

17. The method according to claim 15, wherein checking whether any of the history of syndrome checks meets the criteria of the trapping set determination policy comprises:
applying the trapping set determination policy to the history of syndrome checks corresponding to a set number of iterations that are most recently performed, among the one or more iterations, to check whether the history of syndrome checks meets criteria of the trapping set determination policy.

18. The method according to claim 15, wherein the trapping set determination policy comprises conditions related to at least one of presence or absence of a change in a syndrome vector corresponding to each of a set number of iterations, a relationship between the number of UCNs and a threshold value in each of the set number of iterations, presence or absence of a change in the number of UCNs in each of the set number of iterations, or a change in the number of UCNs in each of the set number of iterations from the number of UCNs in a previous iteration.

19. The method according to claim 18, wherein stopping the error correction decoding comprises stopping the error correction decoding when any one of the conditions included in the trapping set determination policy is satisfied at least once.

20. The method according to claim 18, wherein the condition related to the relationship between the number of UCNs and the threshold value comprises at least one of information about whether the number of UCNs is less than the threshold value in each of the set number of iterations or information about whether the number of UCNs is equal to the threshold value in each of the set number of iterations.

21. The method according to claim 18, wherein the condition related to the change from the number of UCNs in the previous iteration comprises at least one of information about whether the number of UCNs has decreased in the set number of iterations, information about whether the number of UCNs in a current iteration has increased from the number of UCNs in an immediately previous iteration, or information about whether the number of UCNs in the current iteration is equal to the number of UCNs in the immediately previous iteration.

22. The method according to claim 15, wherein the trapping set determination policy comprises:

a first policy to be applied to iterations before a trapping set detector detects a trapping set, among the one or more iterations, and a second policy to be applied to iterations after the trapping set detector has detected the trapping set, among the one or more iterations.

23. The method according to claim 22, wherein the first policy comprises conditions related to at least one of presence or absence of a change in a syndrome vector corresponding to each of a set number of iterations, a relationship between the number of UCNs and a threshold value in each of the set number of iterations, presence or absence of a change in the number of UCNs in each of the set number of iterations, or a change in the number of UCNs in each of the set number of iterations from the number of UCNs in a previous iteration.

24. The method according to claim 23, wherein the condition related to the relationship between the number of UCNs and the threshold value comprises at least one of information about whether the number of UCNs is less than the threshold value in each of the set number of iterations or information about whether the number of UCNs is equal to the threshold value in each of the set number of iterations.

25. The method according to claim 23, wherein the condition related to the change from the number of UCNs in the previous iteration comprises at least one of information about whether the number of UCNs has decreased for the set number of iterations, information about whether the number of UCNs in a current iteration has increased from the number of UCNs in an immediately previous iteration, or information about whether the number of UCNs in the current iteration is equal to the number of UCNs in the immediately previous iteration.

26. The method according to claim 22, wherein the second policy comprises a condition related to whether the number of UCNs in a current iteration is equal to or greater than the number of UCNs in an immediately previous iteration.

27. The method according to claim 22, wherein stopping the error correction decoding comprises:

stopping the error correction decoding when, among the history of syndrome checks corresponding to the one or more iterations, one or more occasions that the history of syndrome checks satisfy the second policy appear at a predetermined number of successive iterations.

28. The method according to claim 15, wherein the error correction decoding is error correction decoding based on a low density parity check (LDPC) code.

* * * * *